United States Patent [19]

Burland

[11] 4,158,890

[45] Jun. 19, 1979

[54] FREQUENCY SELECTIVE OPTICAL DATA STORAGE SYSTEM

[75] Inventor: Donald M. Burland, Los Gatos, Calif.

[73] Assignee: International Business Machines Corporation, Armonk, N.Y.

[21] Appl. No.: 859,422

[22] Filed: Dec. 12, 1977

[51] Int. Cl.[2] ........................ G11C 13/02; G11C 13/04

[52] U.S. Cl. ........................................... 365/119

[58] Field of Search ................................ 365/119, 153

[56] References Cited

U.S. PATENT DOCUMENTS

| | | | |
|---|---|---|---|
| 3,296,594 | 1/1967 | Van Heerden | 365/119 |
| 3,508,208 | 4/1970 | Duguay et al. | 365/119 |
| 3,568,167 | 3/1971 | Carson | 365/119 |
| 3,683,336 | 8/1972 | Brownlee et al. | 365/119 |
| 3,896,420 | 7/1975 | Szabo | 365/119 |
| 4,041,476 | 8/1977 | Swainson | 365/119 |

OTHER PUBLICATIONS

Electronics, Jun. 13, 1966, Absorbing Memories, pp. 37-38.

*Primary Examiner*—Stuart N. Hecker
*Attorney, Agent, or Firm*—Joseph E. Kieninger

[57] ABSTRACT

An optical data storage system that utilizes the frequency dimension to increase the storage capacity. The storage system has a storage material which contains a guest material such as cinnoline, which is dissolved in a host material such as naphthalene. This storage material system exhibits an inhomogeneous absorption line broadening and undergoes a photochemical reaction upon exposure to light.

1 Claim, 1 Drawing Figure

FREQUENCY SELECTIVE OPTICAL DATA STORAGE SYSTEM

FIELD OF THE INVENTION

This invention relates to a frequency selective optical data storage system having a cinnoline type compound as the guest material.

BRIEF DESCRIPTION OF THE PRIOR ART

The patent to Szabo, U.S. Pat. No. 3,896,420 describes an optical data storage system that utilizes the frequency dimension to increase the storage capacity significantly. The Szabo system includes a block of material which can undergo optical saturation and which exhibits inhomogeneous absorption line broadening. Examples of material that may be used in this system are chromium doped ruby, chromium doped magnesium oxide; $O_2$, $S_2$, $Se_2$ and $Se_2S$ in KI and so forth.

A different type of a frequency selective optical data storage system that is non-volatile is described in the co-pending application Ser. No. 768,250 filed Feb. 14, 1977, now U.S. Pat. No. 4,101,976, issued on July 18, 1978 and assigned to the assignee of the present invention. The data storage system in that application is non-volatile, that is, the information will remain in the system even when the power is off for the time period of the order of several minutes. The data storage system requires a material and a laser to write information on the material in the narrow band mode. The material is a very special material having unique characteristics. The material must exhibit inhomogeneous line broadening. In addition, the material is required to undergo a non-volatile photo-induced reaction which involves information stored in the ground state of the molecules when exposed to light. A non-volatile photo-induced reaction is necessary for this material, that is, the molecules of the original material are converted to molecules of a new material or a new material configuration that is the reaction product. The original material is stable and the reaction product is stable, that is, they are both in their ground state.

There are two types of materials suitable for the practice of this type of storage system. One type undergoes a reversible photochemical reaction. An example of this type of material is the free base porphyrin, $H_2P$, in a Shpolskii matrix such as n-octane. In this system, the free base prophyrin is the guest material and the normal octane is the host material. The second type of material undergoes an irreversible photochemical reaction. An example of this type of material is dimethyl-S-tetrazine in durene. Both the tetrazine in durene material system and the free base porphyrin in normal octane system have the fundamental drawback that the concentration of the guest material in the host is very low and cannot be easily controlled.

SUMMARY OF THE INVENTION

It is a primary object of this invention to provide an improved optical data storage system.

It is still another object of this invention to provide a frequency selective optical memory device.

It is yet still another object of this invention to provide a frequency selective optical memory device with a material that undergoes an irreversible photochemical reaction.

It is a further object of this invention to provide an improved material system for a frequency selective optical memory device.

It is another object of this invention to provide a material system for a frequency selective optical storage system having improved solubility characteristics.

These and other objects are accomplished by a frequency selective optical data storage system having a storage material which undergoes an irreversible photochromic reaction or an irreversible photochemical reaction. The improved storage material system includes a guest material of cinnoline or a cinnoline type material which is dissolved in a host material of naphthalene or durene.

Other objects of this invention will be apparent from the following detailed description, reference being made to the accompanying drawings wherein a specific embodiment of the invention is shown.

DESCRIPTION OF THE ILLUSTRATIVE EMBODIMENT

Figure 1:
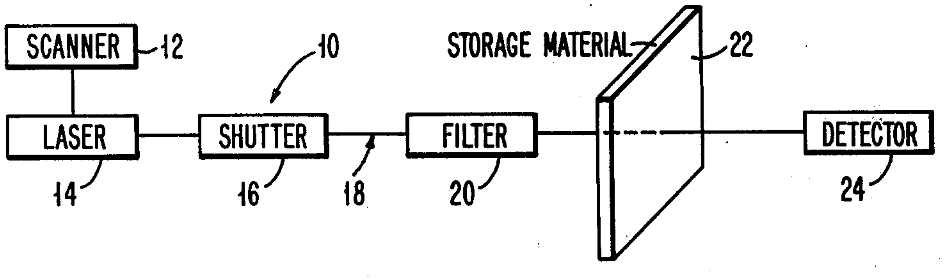
FIG. 1 is a schematic view of the data storage system including the improved storage material.

An optical data storage system suitable for storing data in the frequency dimension to provide a third dimension of the type described in co-pending application Ser. No. 768,250 filed Feb. 14, 1977, and which is incorporated herein by reference thereto is shown in FIG. 1. The system 10 includes a laser 12 having a scanner 14 associated thereto which permits the frequency of the laser to be varied as is standard in the art. The light from laser 12 is passed through a shutter 16 which enables light at its selective frequencies to pass therethrough. The filter 20 and the detector 24 are not used during the write cycle but they are used during the read function of the system.

The laser 12 has to be frequency stabilized, tunable over the frequency range of the inhomogeneous line width, in operator narrow band mode. The laser can be focused down to the dimension of the order of 1 micron. Dimensions of this size yields spot densities of $10^8/cm^2$. The spatial deflection of the laser (not shown) is accomplished with optical means well known in the art.

The storage material 22 in accordance with this invention is a layer or block of material which is adapted to undergo a photo induced reaction upon exposure to light. This irreversible photo induced reaction would be a photo chemical or a photochromic reaction, that is, a light induced change in the materials's optical properties.

In accordance with this invention, the storage material 22 consists of a host material and a guest material dissolved therein. The guest material is a cinnoline type material having the structure set forth below

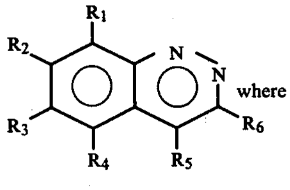

where $R_{1-6}$=H, $CH_3$, Cl, I or Br.

It is understood that $R_1$, for example, may be the same as or different from any of the other R's, for example, $R_1$–$R_5$. The preferred guest material is cinnoline where $R_{1-6}$ are all H's.

The host material is either naphthalene,

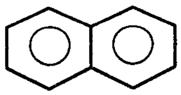

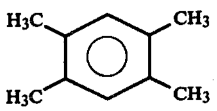

or durene,

The solubility of cinnoline in naphthalene is at least $10^{-2}$ wt % with the preferred concentration being in the range of $10^{-5}$ to $10^{-6}$ wt. %.

The host and guest materials are weighed to provide a specific concentration, for example, $10^{-5}$ wt % guest material. These materials are placed in a crystal growing tube and sealed. The mixture is melted and slowly moved through a temperature gradient to grow the crystal. This crystal is then used in the form of a layer or block material and exposed to light, preferably from a laser.

EXAMPLE No. 1

A crystal was grown containing $10^{-5}$ to $10^{-6}$ wt % cinnoline in naphthalene. This material had an absorption spectrum with a band from 4488 A° to 4492 A° with a peak at 4490 A°. A layer of this material was exposed to an $N_2$ pumped pulsed dye laser. The laser burned a hole in the spectrum at 4490 A°.

EXAMPLES NO. 2, 3 and 4

Other crystals were grown with $19^{-2}$ wt %, $10^{-3}$ wt % and $10^{-4}$ wt % cinnoline in naphthalene. These crystals were also of suitable quality, although the concentration was higher than the preferred hole burning concentration.

Although a preferred embodiment of this invention has been described, it is understood that numerous variations may be made in accordance with the principles of this invention.

What is claimed is:

1. A frequency selective optical data storage system having a laser that can write non-volatile information on an organic storage material, said storage material comprising:

a solid host material of naphthalene; and cinnoline dissolved in said host material to provide a concentration therein of between $10^{-2}$ wt % and $10^{-6}$ wt % wherein said cinnoline upon exposure to light from said laser undergoes an irreversible photo-induced reaction resulting information stored in the non-volatile ground state of said cinnoline in the frequency dimension.

* * * * *